United States Patent
Kaunisto et al.

(10) Patent No.: US 8,428,545 B1
(45) Date of Patent: Apr. 23, 2013

(54) FILTER CIRCUITRY

(71) Applicant: Renesas Mobile Corporation, Tokyo (JP)

(72) Inventors: Risto Heikki Sakari Kaunisto, Espoo (FI); Jouni Kristian Kaukovuori, Vantaa (FI); Petri Tapani Eloranta, Espoo (FI); Jari Johannes Heikkinen, Helsinki (FI); Jonne Juhani Riekki, Espoo (FI)

(73) Assignee: Renesas Mobile Corporation, Tokyo (JP)

( * ) Notice: Subject to any disclaimer, the term of this patent is extended or adjusted under 35 U.S.C. 154(b) by 0 days.

(21) Appl. No.: 13/675,073

(22) Filed: Nov. 13, 2012

(30) Foreign Application Priority Data

May 15, 2012 (GB) .................................. 1208544.5

(51) Int. Cl.
*H04B 1/16* (2006.01)

(52) U.S. Cl.
USPC ........... 455/334; 455/120; 455/323; 375/350; 333/172

(58) Field of Classification Search .......... 455/118–120, 455/255–260, 313, 323, 333, 334, 339–341; 375/295, 316, 340, 350; 333/165–167, 172–175
See application file for complete search history.

(56) References Cited

U.S. PATENT DOCUMENTS

| | | | |
|---|---|---|---|
| 5,517,687 A * | 5/1996 | Niehenke et al. | 455/325 |
| 6,587,018 B1 | 7/2003 | Meck et al. | |
| 7,003,275 B1 * | 2/2006 | Petrovic | 455/323 |
| 7,590,391 B2 * | 9/2009 | Seo et al. | 455/90.2 |
| 7,646,264 B2 * | 1/2010 | Petrovic | 333/176 |
| 7,945,221 B2 * | 5/2011 | Derouet et al. | 455/91 |
| 8,244,202 B2 * | 8/2012 | Kitayabu | 455/344 |
| 2004/0041634 A1 | 3/2004 | Sugiura | |
| 2008/0287089 A1 | 11/2008 | Alles | |

FOREIGN PATENT DOCUMENTS

CN 102394664 A 3/2012

OTHER PUBLICATIONS

Search Report under Section 17 dated Sep. 25, 2012 which is issued in a related British Application No. GB1208544.5.0 (5 pages).

* cited by examiner

*Primary Examiner* — Nhan Le

(74) *Attorney, Agent, or Firm* — Lucas & Mercanti LLP; Robert P. Michal

(57) ABSTRACT

Circuitry for use in a direct conversion transmitting or receiving chains includes mixing circuitry which converts baseband signal to radio frequency or vice versa. A local oscillator to provide a signal having a first component and a second component at a harmonic of the first to the mixing circuitry. The circuitry has a filter circuit which attenuates signals output at a first frequency by an amount which is low relative and which attenuates signals output at a second frequency by an amount which is high, both being relative to the attenuation of signals output at frequencies other than the second frequency. The filter circuit is tunable to vary the frequencies, and configured such that the second frequency is maintained at a predetermined integer multiple of the first frequency.

16 Claims, 13 Drawing Sheets

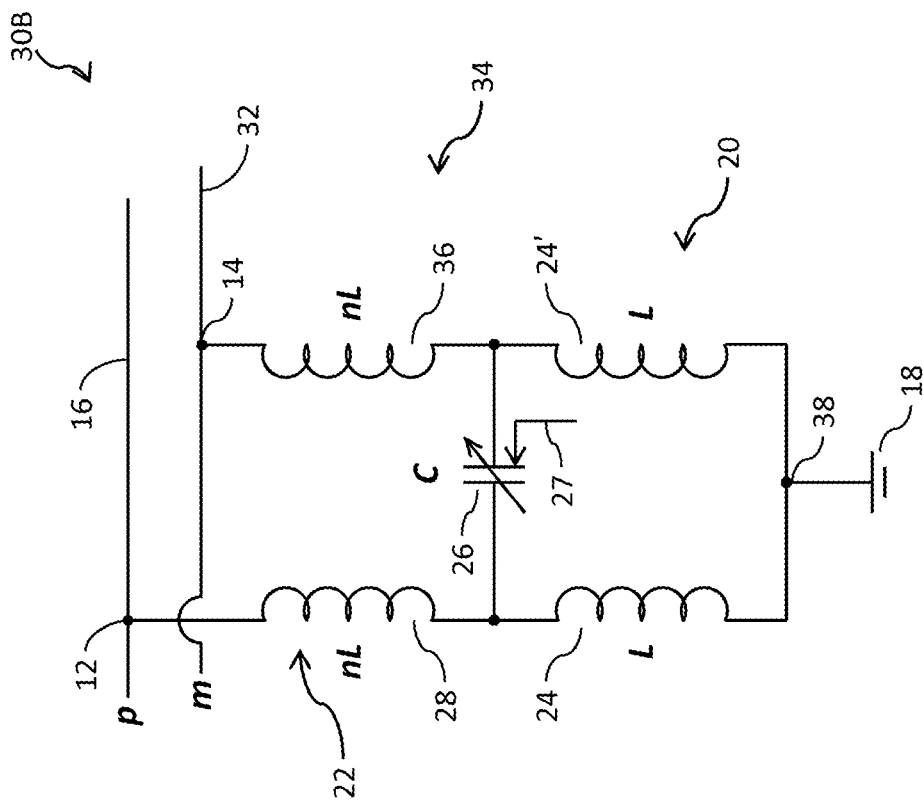
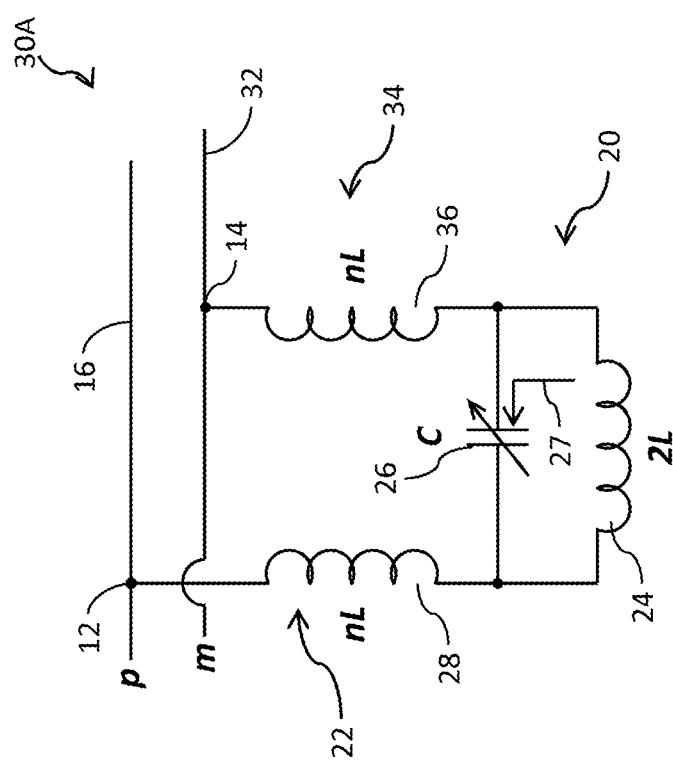
Fig 3B
Fig 3A

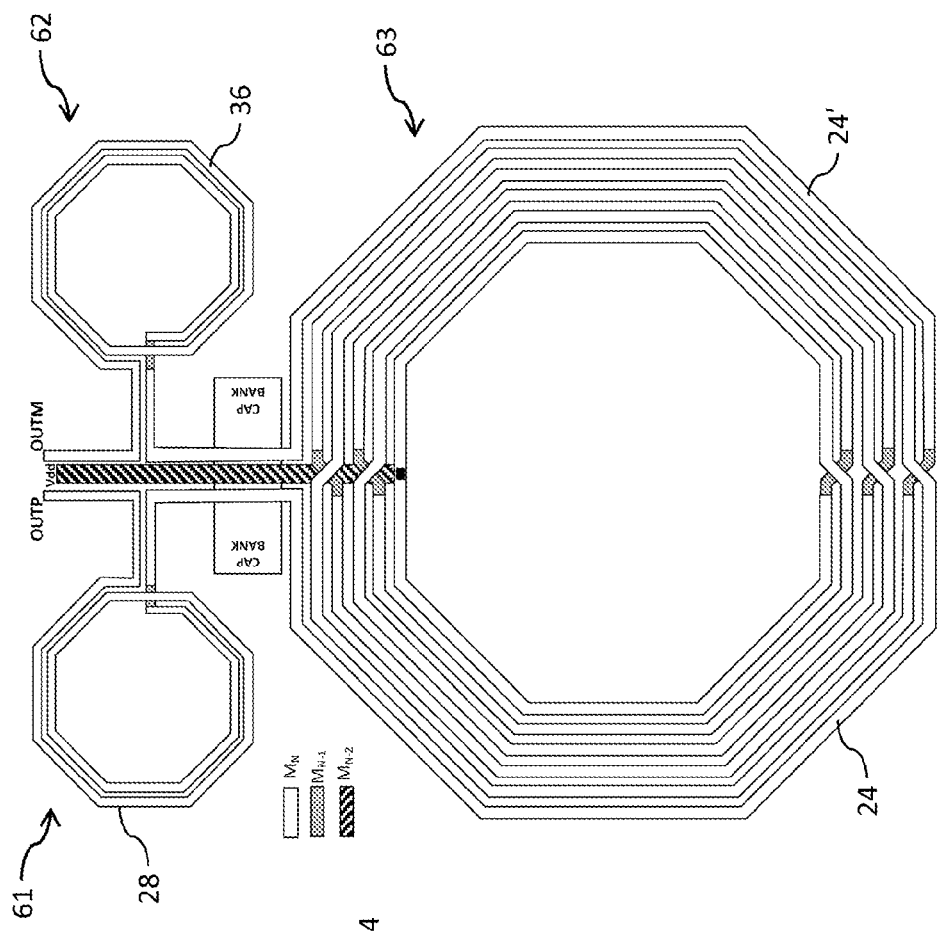
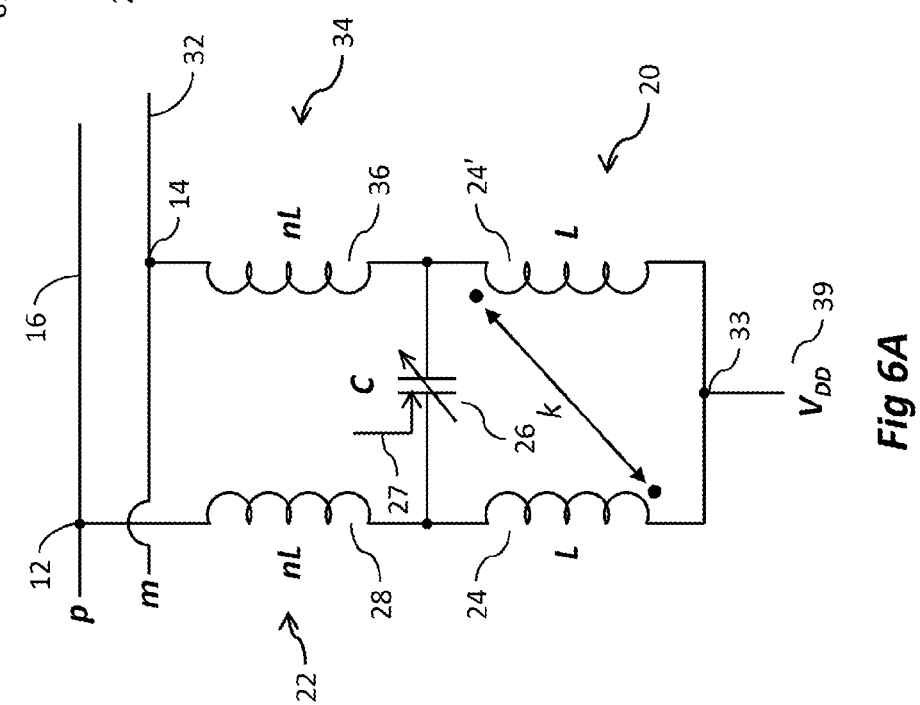
Fig 6B
Fig 6A

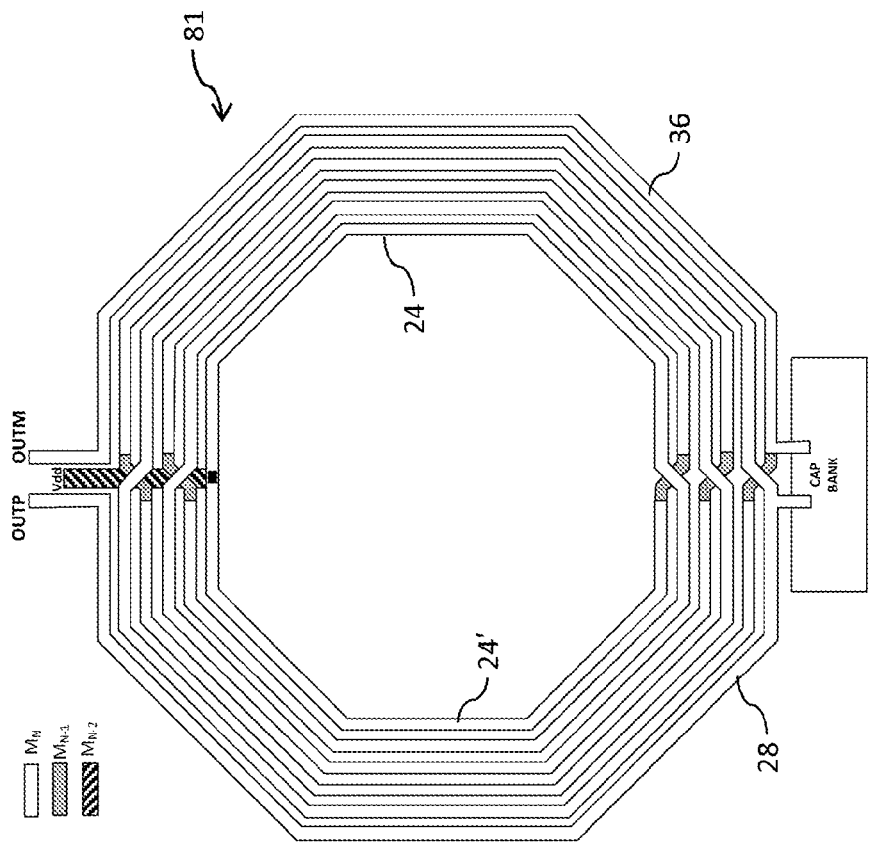
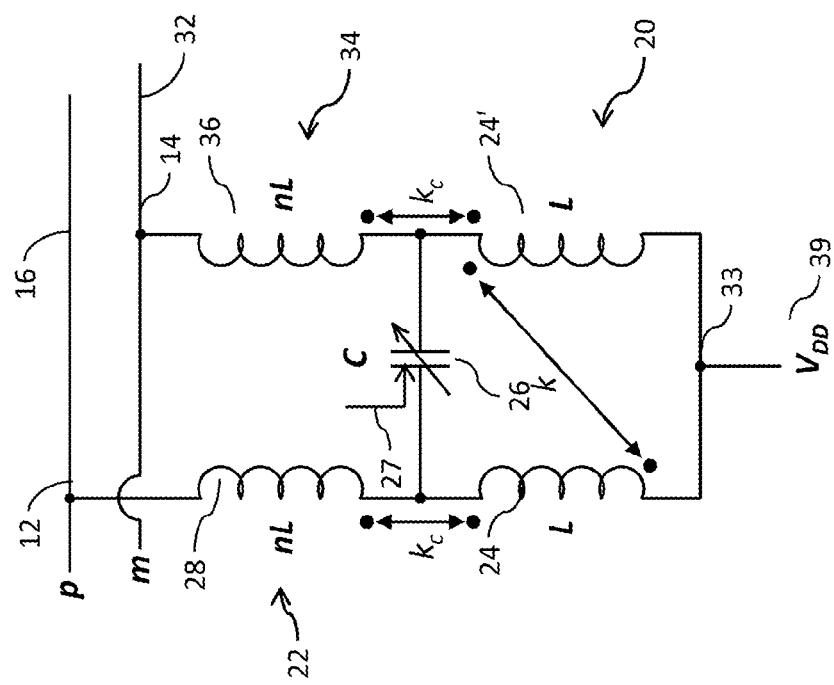
Fig 8B
Fig 8A

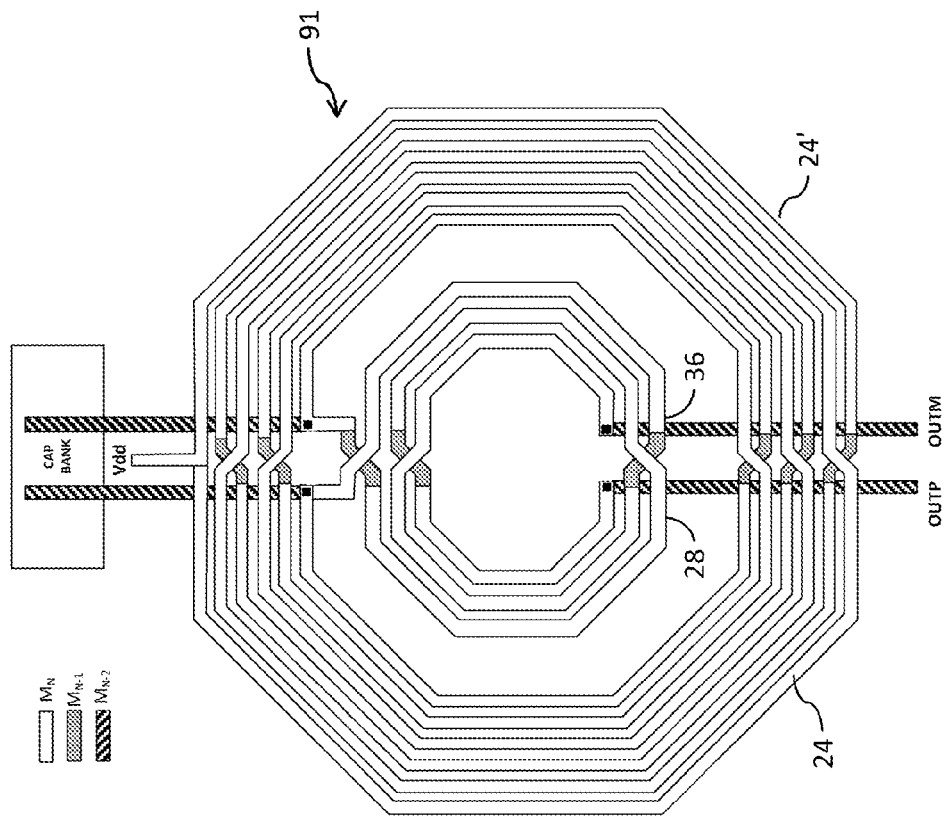
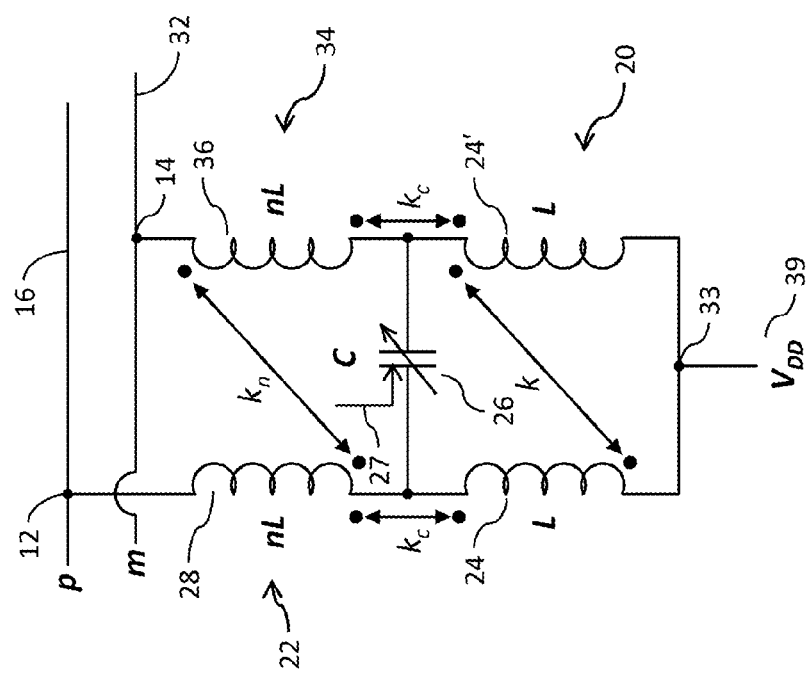
Fig 9A
Fig 9B

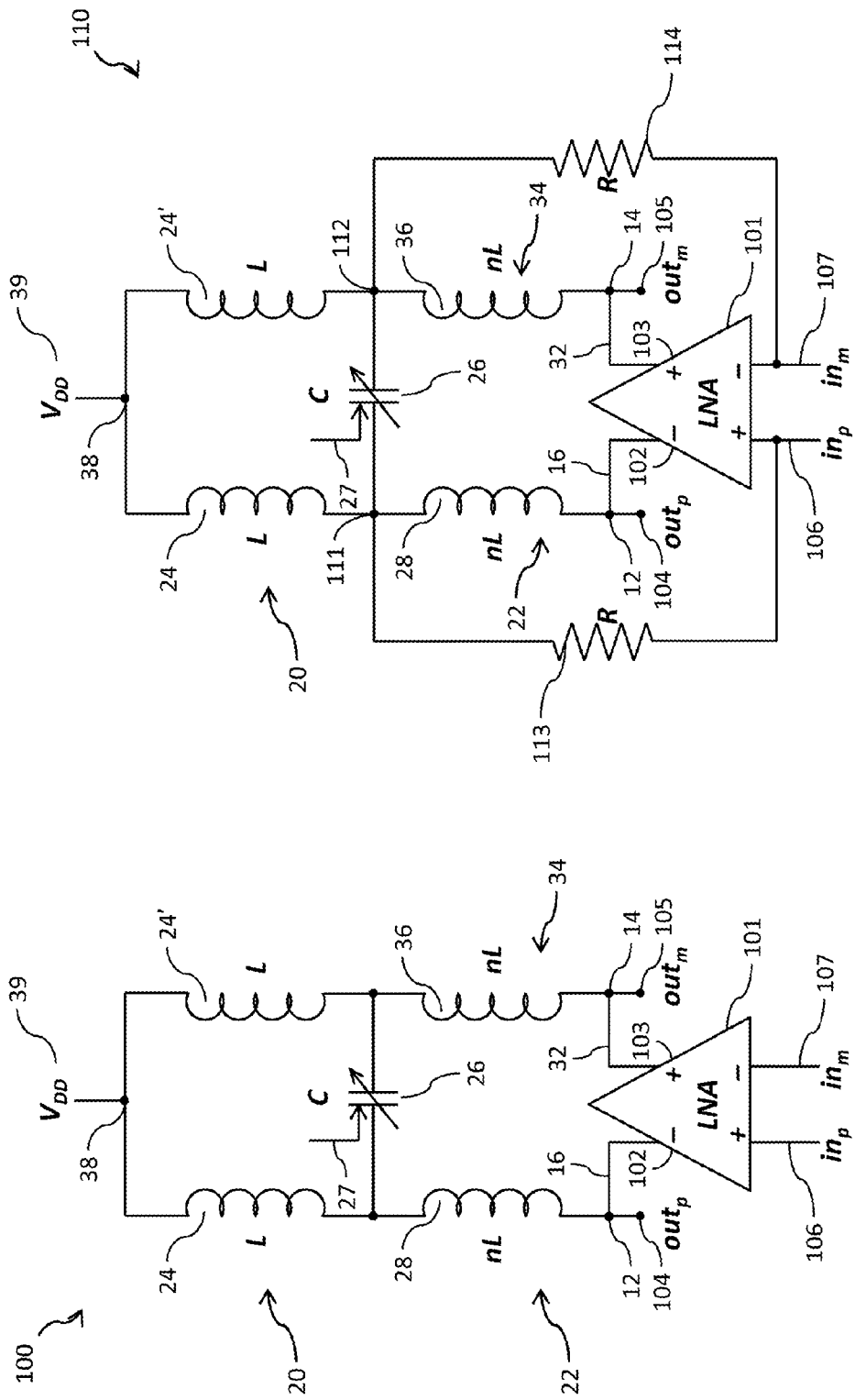

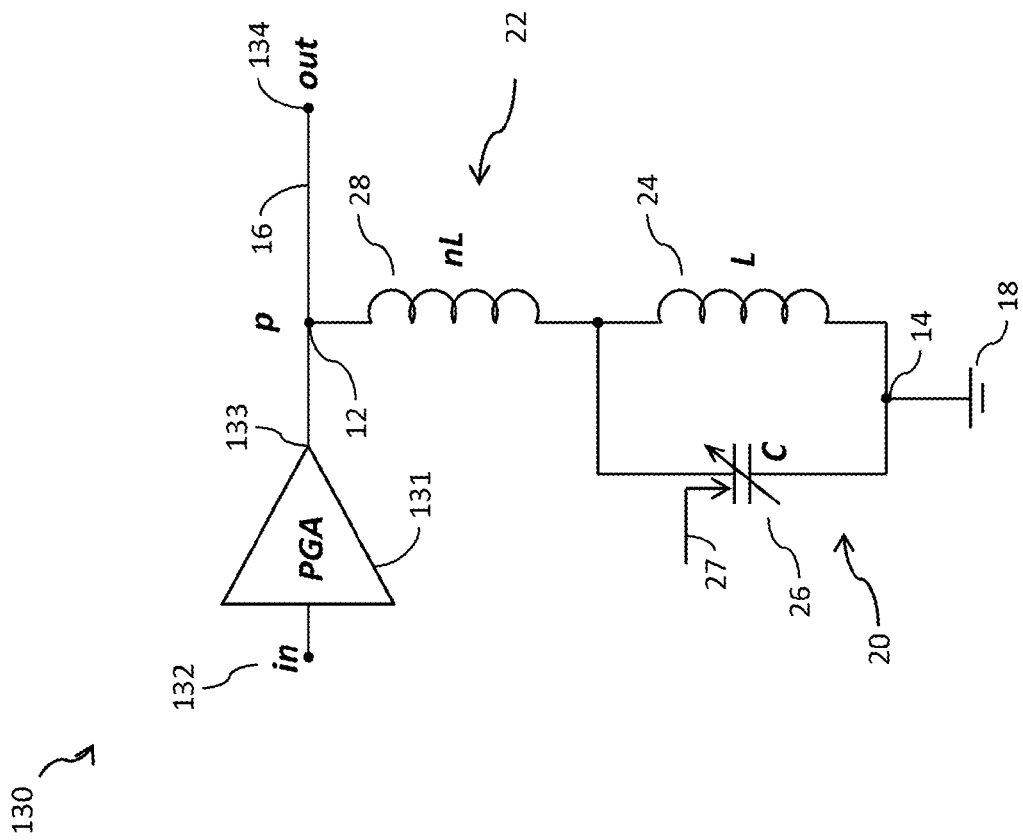
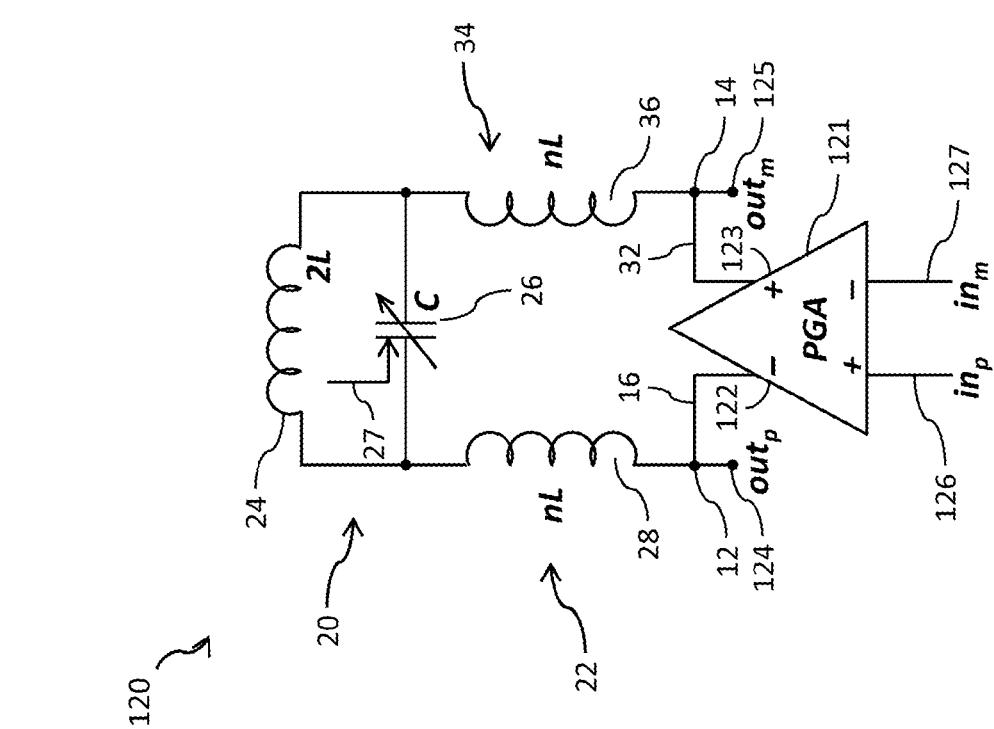
Fig 13
Fig 12

FILTER CIRCUITRY

CROSS REFERENCE TO RELATED APPLICATION

This application claims the benefit of foreign priority under 35 U.S.C. §119(a) and 37 CFR §1.55 to UK Patent Application No GB 1208544.5, filed on 15 May 2012, the content of which is incorporated herein by reference in its entirety.

FIELD OF THE INVENTION

The present invention relates to systems and methods for filtering a signal, and in particular to filtering a radio frequency signal containing a strong unwanted signal.

BACKGROUND

Radio receiving and transmitting circuitry often uses filter circuitry to decrease the level of unwanted signals in relation to a desired signal. Resonant circuits containing combinations of inductors, capacitors and resistors may be used to provide such filter circuitry. Such circuits are known as LC (for inductor-capacitor circuits) or RLC (for resistor-inductor-capacitor circuits).

On example of the use of an LC circuit as a filter will be described below. In this example the filter is arranged between a signal line and a line carrying a fixed voltage, typically a ground or supply voltage—$V_{DD}$—line. The LC circuit comprises a capacitor and an inductor in parallel. The impedance of this parallel LC circuit across most of the frequency spectrum is relatively low. However in a certain range near to the circuit's resonant frequency, the impedance of the parallel LC circuit is relatively high.

In operation, the parallel LC circuit will attenuate signals on the signal line in dependence on the parallel LC circuit's impedance at the frequency of the signals. Signals at a frequency where the LC circuit has a relatively low impedance will be attenuated; that is, these signals will experience a large reduction in signal level. This is because these signals will be connected to ground/$V_{DD}$ by a low impedance connection, and thus will be grounded or shorted out. By contrast, signals at a frequency where the LC circuit has a relatively high impedance, will not be attenuated as much; that is these signals will have only a small reduction in signal level. This is because such signals will be relatively isolated from the ground/$V_{DD}$ line.

Such an LC circuit provides a simple band-pass filter, because only 'in-band' signals—those at, or near, the LC circuit's resonant frequency—will pass without significant attenuation. By contrast, out-of-band signals will be attenuated.

In some situations, the degree of filtering provided by the filter circuitry may be insufficient. In other words the attenuation of the out-of-band signals will be insufficient to prevent detrimental performance of the system in which the filter is embedded. This is a particular, and increasing, problem in both transmitters and receivers, because regulations limiting out of band transmissions are becoming stricter and the increase in radio transmissions from other sources has increased the quantity of interference experienced by a typical receiver.

Embodiments described herein are intended to address these problems.

SUMMARY OF THE INVENTION

In accordance with at least one embodiment, methods, devices, circuitry and systems are provided for supporting or implementing functionality to provide a filtering circuit, and for providing a transmitter, receiver or transceiver system incorporating the same.

This is achieved by a combination of features recited in each independent claim. Accordingly, dependent claims prescribe further detail of embodiments.

In accordance with a first embodiment, there is provided circuitry for use in a direct conversion receiving chain for a radio receiver, the circuitry comprising: mixing circuitry configured to downconvert radio frequency signals to baseband; a local oscillator configured to provide a local oscillator signal to the mixing circuitry for use in the downconversion, the local oscillator signal comprising a first component and a second component corresponding to a harmonic of the first component; and a filter circuit configured to filter radio frequency signals input thereto and to output filtered radio frequency signals to the mixing circuitry, wherein the filter circuit is configured to attenuate radio frequency signals output at a first frequency by an amount which is low relative to the attenuation of signals output at frequencies other than the first frequency, and to attenuate signals output at a second frequency by an amount which is high relative to the attenuation of signals output at frequencies other than the second frequency, the filter circuit being tunable such that the first frequency can be tuned to correspond to a frequency of the first component of the local oscillator signal, and the filter circuit being configured such that the second frequency is maintained at a predetermined integer multiple of the first frequency.

In accordance with a second embodiment, there is provided circuitry for use in a direct conversion transmitting chain for a radio transmitter, the circuitry comprising: mixing circuitry configured to upconvert a baseband signal and thereby output an upconverted radio frequency signal; a local oscillator configured to provide a local oscillator signal to the mixing circuitry for use in the upconversion, the local oscillator signal comprising a first component and a second component corresponding to a harmonic of the first component; and a filter circuit configured to filter radio frequency signals output by the mixing circuitry, wherein the filter circuit is configured to attenuate radio frequency signals output at a first frequency by an amount which is low relative to the attenuation of signals output at frequencies other than the first frequency, and to attenuate signals output at a second frequency by an amount which is high relative to the attenuation of signals output at frequencies other than the second frequency, the filter circuit being tunable such that the first frequency can be tuned to correspond to a frequency of the first component of the local oscillator signal, and the filter circuit being configured such that the second frequency is maintained at a predetermined integer multiple of the first frequency.

Further features will become apparent from the following description of embodiments, given by way of example only, which is made with reference to the accompanying drawings.

BRIEF DESCRIPTION OF THE DRAWINGS

Filtering circuits, receiver circuitry and transmitter circuitry will now be described as embodiments, by way of example only, with reference to the accompanying figures in which:

FIGS. 3A and 3B show circuit diagrams of filter circuits according to embodiments;

FIGS. 6A . . . B to 9A . . . B show circuit diagrams and design layouts for circuits according to embodiments;

FIGS. 10 and 11 show circuit diagrams for filter circuits in combination with a low noise amplifier according to embodiments;

FIGS. 12 and 13 show circuit diagrams for filter circuits in combination with a programmable gain amplifier according to embodiments;

Several parts and components of the embodiments appear in more than one Figure; for the sake of clarity the same reference numeral will be used to refer to the same part and component in all of the Figures.

DETAILED DESCRIPTION OF ILLUSTRATIVE EMBODIMENTS

Figure 1:
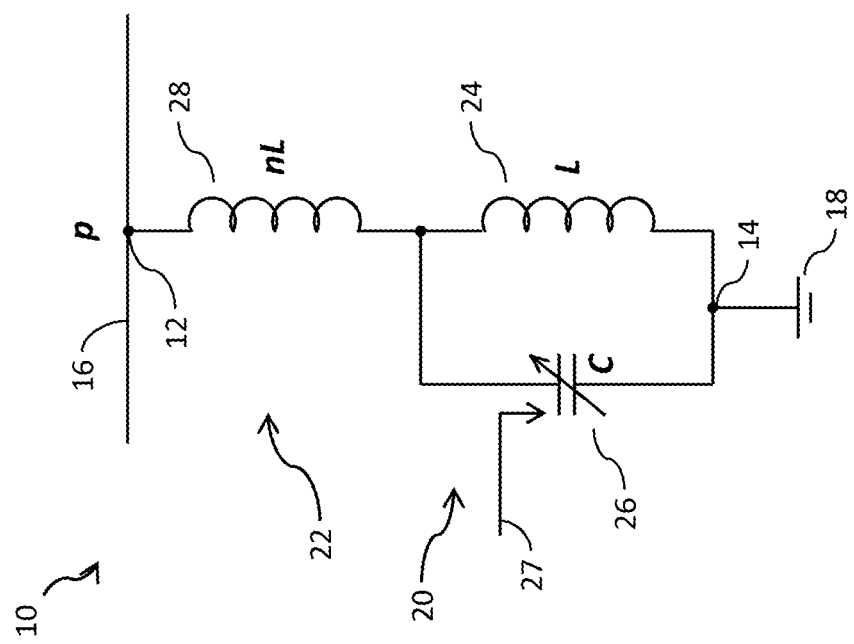
FIG. 1 shows a circuit diagram of a filter circuit according to an embodiment.

The inventors have recognized a problem in radio frequency circuitry, and in particular CMOS direct conversion radio circuitry. Direct conversion radio circuitry uses a mixer to convert between a radio frequency (RF) signal and a base band (BB) signal. The mixer in a transmitter receives a BB signal and upconverts the BB signal to RF using a signal from a local oscillator (LU). The mixer in a receiver receives a RF signal, and downconverts this RF signal to BB using the LO signal. The operation of such mixers is well known in the art and will not be described in detail herein. In a CMOS direct conversion radio circuit, a rail-to-rail square waveform is often used as the LO input to the mixer. A square wave has high harmonic content. In particular a square wave has significant odd numbered harmonics, the most significant of these being the third order harmonic.

The problems identified by the inventors are particularly apparent where there is a strong harmonic content in the LO input to a mixer. This makes embodiments particularly relevant to CMOS direct conversion radio circuits. Nevertheless, this is not the only application of embodiments, which may be used in any radio frequency apparatus.

Examples in both a transmitter and a receiver, exemplifying problems in radio receivers and transmitters which are addressed by embodiments will now be described.

Current cellular receivers may operate in Band 20, which corresponds to the frequency range from 791 to 821 MHz. In addition, unlicensed radio transceiving equipment, such as Bluetooth and 802.11 (WiFi) equipment, may operate in the industrial, scientific and medical (ISM) radio band from 2.4 to 2.5 GHz.

In a direct conversion receiver tuned to Band 20, the LU signal will be tuned to a signal at or around 800 MHz (depending on the channel used). The third order harmonic of this LO signal will therefore correspond to a signal at or around 2.4 GHz. As a consequence of this, a mixer in a receiver tuned to Band 20 will downconvert both the desired signal at 800 MHz (using the fundamental frequency from the LU signal) as well as unwanted signals at 2.4 GHz (using the third harmonic signal in the LU output). In both cases the signals will be downconverted to baseband.

It may be the case that the radio frequency signals picked up by the receiver also comprises signals at, or around the harmonic frequencies of the LO signal, i.e. WiFi signals at 2.4 GHz. The received radio frequency signals may be filtered using a filter, such as a parallel LC circuit as described above, tuned to 800 MHz, to attenuate any unwanted signals. However, if the unwanted, 2.4 GHz signal is strong —for instance if the receiver is close to a 2.4 GHz transmitter —then the attenuation of the unwanted signal by the filter may be insufficient. As a consequence, the unwanted signal will be present in the baseband output of the mixer. This signal may reduce the signal-to-noise ratio of the desired signal, and therefore the overall performance of the receiver.

Radio transmitters need to minimize undesired out-of-band transmission to avoid interfering with other radio equipment. Standards, such as the 3rd Generation Partnership Project Long Term Evolution (3GPP-LTE) standards, present increasingly strict requirements to minimize undesired out-of-band transmissions.

One example of undesired out-of-band transmissions is the transmitting of unwanted signals in channels or bands neighbouring the channel/band being used to transmit the intended signal. Transmissions in such neighbouring channels are typically caused by intermodulation in elements within the transmitting chain. Intermodulation occurs when nonlinearities in a given circuit element cause two input signals of different frequencies to be undesirably combined. Intermodulation creates additional signals at frequencies which are at the sum and/or difference of integer multiples of the input frequencies. One such intermodulation product is the third-order counter intermodulation (C-IM3) component. The C-IM3 may be generated in a Programmable Gain Amplifier (PGA) operating in a transmitter at radio frequencies.

In a direct conversion transmitter, where the local oscillator provides a frequency $f_{LO}$, and the baseband signal is at $f_{BB}$, the C-IM3 components are located at $f_{LO} \pm 3f_{BB}$. One particularly strong cause of such C-IM3 components is the intermodulation of the wanted signal with the result of the BB signal being mixed with the third order harmonic of the LO (the RF HD3 signal). The wanted signal has a frequency of $f_{LO} \pm f_{BB}$, and the RF HD3 signal has a frequency of $3f_{LO} \pm f_{BB}$. Thus, third order intermodulation products are located at frequencies of:

$$3f_{LO}+f_{BB}-2(f_{LO}-f_{BB})=f_{LO}+3f_{BB}; \text{ and}$$

$$3f_{LO}-f_{BB}-2(f_{LO}+f_{BB})=f_{LO}-3f_{BB}$$

This intermodulation product is significant in transmitters where a strong third harmonic component (the RF HD3 signal) is present in the output of the mixer. For example, a CMOS direct conversion transmitter typically uses a square wave as the LO input signal to the mixer. Since a square wave has strong odd numbered harmonics, a strong third harmonic component is present.

A second example of undesired out-of-band transmissions occurs where a power amplifier, or other circuit element handling RF signals within a transmitter, generates harmonics of the signal to be transmitted. These harmonics may be unrelated to harmonics present in the LO signal. As a consequence, a transmitter may transmit relatively strong, undesired signals at frequencies corresponding to harmonics of the desired signal. In some cases, a downlink (DL—i.e. received—signal may correspond to a harmonic of an uplink (UL)—i.e. transmitted —signal. Thus the harmonics generated in the power amplifier may corrupt receiver performance. Equally, a undesired signal at a harmonic of a desired signal may be at a frequency to interfere with other radio access system like GPS or WLAN. For example, a Band 14 UL causing a second order harmonic will have a strong undesired signal which overlaps with the 1.575 GHz GPS signals.

A filter circuit according to an embodiment, which addresses these problems, will now be described with reference to FIG. 1.

In FIG. 1, the filter circuit 10 has a first connection 12 which is connected to a signal line 16 carrying a varying voltage representing both desired and unwanted signals. The filter circuit has a second connection 14. In this embodiment the connection 14 is connected to a reference line, held at a reference voltage. In this case the reference line is ground 18, however an alternative reference line may be used, such as $V_{DD}$.

The circuit 10 has a first circuit portion 20, and a second circuit portion 22. The first circuit portion 20 comprises a parallel resonant circuit. The parallel resonant circuit comprises a variable capacitor 26 connected in parallel with a first inductor 24. The capacitor 26 has an input 27 which provides a control signal used to vary the capacitance C so as to tune the circuit as will be described below. The first inductor 24 has an inductance L, which is fixed (i.e. is determined at fabrication). The second circuit portion 22 comprises a second inductor 28. This second inductor has an inductance nL. The factor n represents the ratio of the inductance of the second inductor 28 to the inductance of the first inductor 24. The first circuit portion 20 and the second circuit portion 22 are connected in series between the first connection 12 and the second connection 14.

The operation of the circuit 10 described above in FIG. 1 will now be described with reference to the following equations and to FIGS. 2A and 2B. As mentioned in the introductory section, a circuit connected between a signal line and a reference line may act as a filter where the degree of attenuation generated by the filter is related to the impedance of the circuit as a whole. At frequencies where the circuit 10 has a low impedance, the attenuation to the signal is high, as these signals will be shorted out to the reference voltage. At frequencies where the circuit 10 has a high impedance, the attenuation to the signal is low, as these signals will relatively isolated from the reference voltage.

The impedance z(s) of the circuit 10 can be calculated by combining the impedances of the capacitor 26 and the two inductors 24 and 28. This is given by equation 1:

$$z(s) = snL + \left[\frac{1}{sL} + sC\right]^{-1} \quad (1)$$
$$= snL + \frac{sL}{1+s^2LC}$$
$$= \frac{sL(1+n) + s^3nL^2C}{1+s^2LC}$$

From equation 1 above, it can be seen that the impedance z(s) of the circuit will have a maximum when the denominator is zero, i.e. when:

$$1+s^2LC=0 \quad (2)$$

Equally, it can be seen that the impedance z(s) of the circuit will be at a minimum when the numerator is zero, i.e. when:

$$sL(1+n)+s^3nL^2C=0 \quad (3)$$

For a sinusoidal AC signal, s is related to frequency by:

$$s=j\cdot\omega=2\pi\cdot j\cdot f \quad (4)$$

Therefore, substituting equation 4 into equation 2, a first frequency, $f_{peak}$, at which the impedance z(s) of the circuit is at a maximum is:

$$f_{peak} = \frac{1}{2\pi\sqrt{LC}} \quad (5)$$

At the first frequency $f_{peak}$, the impedance is at a maximum, and therefore the attenuation of a signal by the circuit is at a minimum.

As described above, the capacitor 26 is a variable capacitor; therefore the first frequency $f_{peak}$ may be tuned to a desired frequency by varying the capacitance of the capacitor 26. It will be apparent that the first frequency $f_{peak}$ is the resonant frequency of the first circuit portion 20 of the circuit 10.

Similarly, substituting equation 4 into equation 3, a second frequency, $f_{notch}$, at which the impedance z(s) of the circuit is at a minimum is:

$$f_{notch} = \sqrt{\frac{n+1}{n}} \frac{1}{2\pi\sqrt{LC}} \quad (6)$$

At the second frequency $f_{notch}$ the impedance of circuit 10 is at a minimum, and therefore the attenuation of a signal by the circuit is at a maximum. This second frequency $f_{notch}$ may be tuned to a desired frequency by varying the capacitance of the capacitor 26. It will be apparent that the second frequency $f_{notch}$ is the resonant frequency caused by the first circuit portion 20 resonating with the second circuit portion 22.

In addition, by substituting equation 5 into equation 6, it can be seen that the first and second frequencies, $f_{peak}$ and $f_{notch}$ have a fixed ratio, which is maintained irrespective of the capacitance of the capacitor 26 and thus the values of the frequencies $f_{peak}$ and $f_{notch}$; specifically $$f_{notch} = \sqrt{\frac{n+1}{n}} f_{peak} \quad (7)$$

Therefore:

$$\frac{f_{notch}}{f_{peak}} = \sqrt{\frac{n+1}{n}} \quad (8)$$

The ratio of the first and second frequencies may be denoted by parameter H, where:

$$\frac{f_{notch}}{f_{peak}} = H = \sqrt{\frac{n+1}{n}} \quad (9)$$

Rearranging equation 9 gives a value for n in terms of a desired ratio of frequencies, H:

$$n = \frac{1}{H^2 - 1} \quad (10)$$

Figure 2B:
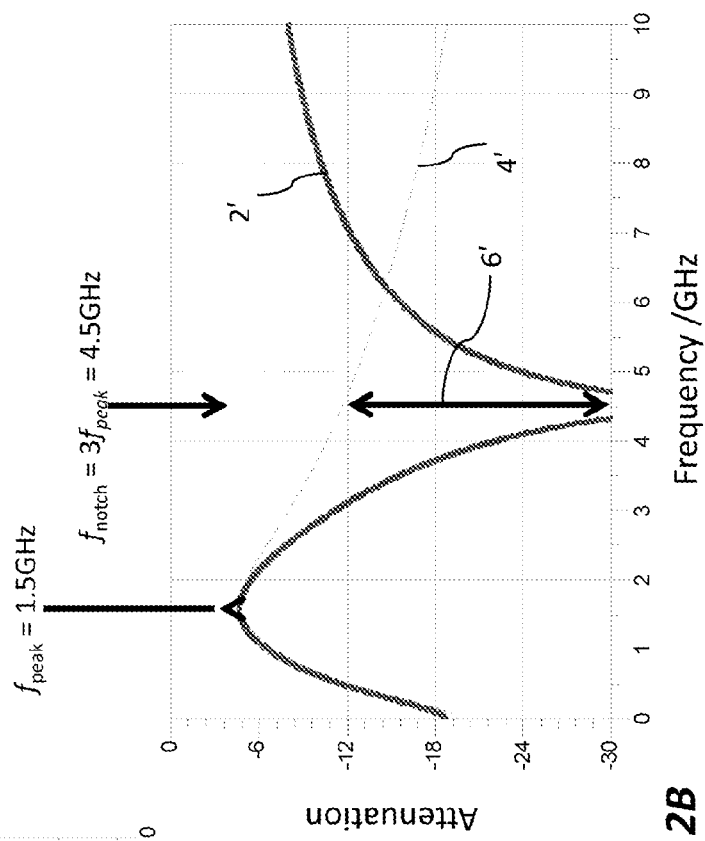
FIGS. 2A and 2B show plots of frequency responses for filter circuits.
Figure 2A:
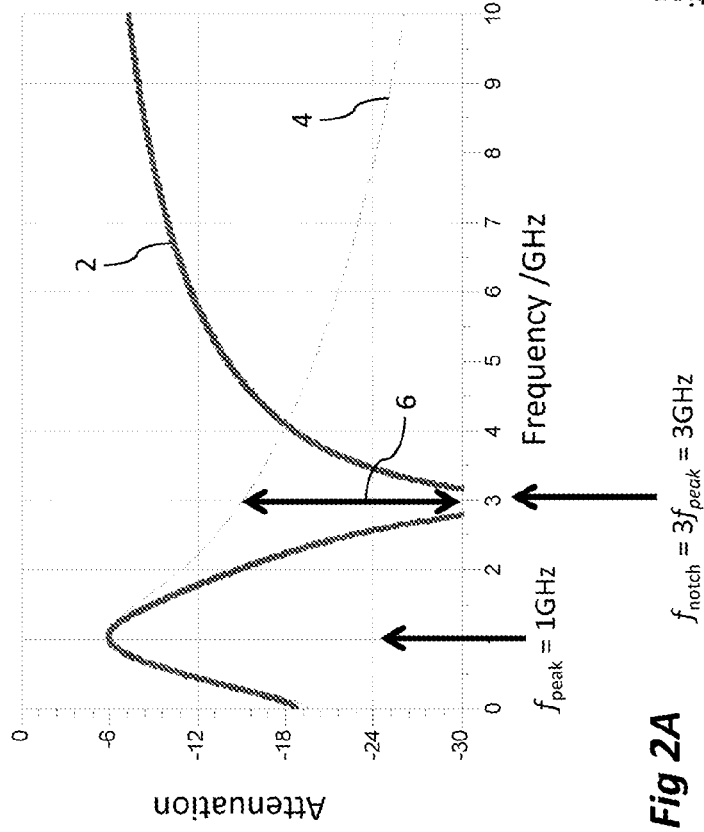

FIGS. 2A and 2B show exemplary plots of attenuation against frequency for two configurations of a circuit according to an embodiment, such as circuit 10 shown in FIG. 1. The values for the inductors L and nit were selected such that n=⅛ in both configurations, while the value of capacitance of variable capacitor 26 differs between the two configurations.

FIG. 2A shows a plot of attenuation against frequency where the variable capacitor 26 was adjusted such that:

$$f_{peak} = \frac{1}{2\pi\sqrt{LC}} = 1 \text{ GHz}$$

Since n=⅛, the ratio H=3. Accordingly, $f_{notch}$ has a value of 3 GHz.

In FIG. 2A, the thick line 2 indicates the attenuation of circuit 10. As can been seen, there is a relatively low attenuation for signals at and around 1 GHz ($\approx f_{peak}$). There is also a relatively high attenuation for signals at and around 3 GHz ($\approx f_{notch}$). For signals at other frequencies, the attenuation is between the two extremes.

For comparison purposes, the thin line 4 shows the attenuation of a circuit comprising solely an inductor and a capacitor in parallel (i.e. the circuit described in the background section). As can be seen, while the comparison circuit provides a relatively low attenuation for signals at and around 1 GHz, the attenuation for signals at and around 3 GHz is substantially lower than for circuit 10, as indicated by arrow 6.

FIG. 2B shows a similar plot to FIG. 2A, except that in this plot the capacitor 26 has been adjusted such that:

$$f_{peak} = \frac{1}{2\pi\sqrt{LC}} = 1.5 \text{ GHz}$$

Since the ratio H between the frequencies $f_{peak}$ and $f_{notch}$ is fixed based on n, $f_{notch}$ takes the value of 4.5 GHz.

The plot in FIG. 2B takes a similar shape to that in FIG. 2A. Line 2' includes a peak at 1.5 GHz representing relatively low attenuation and a trough at 4.5 GHz representing relatively high attenuation. Line 4' representing a simple parallel LC circuit is also plotted. The difference in attenuation at $f_{notch}$ is represented by arrow 6'.

This illustrates some advantages of embodiments. First, in comparison to a parallel LC circuit, there is significantly greater attenuation of signals in a narrow frequency range at and around $f_{notch}$. This provides improved filtering performance when there is a strong, unwanted, signal which needs to be filtered out, and which is of sufficient strength that a parallel LC circuit is unable to provide sufficient filtering performance.

Secondly, while $f_{peak}$ and $f_{notch}$ can be tuned by varying the capacitance of the capacitor 26, they will maintain a fixed ratio; this ratio being determined only by n, the ratio between the inductances of inductors 24 and 28. In the example circuit used to generate these plots, n was selected so that the ratio between the frequencies was three. Therefore, irrespective of the frequency $f_{peak}$ to which the circuit is tuned, the frequency corresponding to high attenuation, $f_{notch}$, was maintained at $3 \times f_{peak}$, which is the frequency of the third harmonic.

Therefore, the circuit described above, if constructed with a ratio of inductances of ⅛, is able to strongly attenuate third harmonics in addition to providing band-pass filtering for the fundamental (i.e. desired) frequency. Moreover, to achieve this performance over a variable frequency range, the circuit only needs a single control circuit to control the tuning.

It will be apparent that a frequency ratio of three is only exemplary, and that the circuit may be arranged such that any fixed ratio of frequencies may be used. Specific examples include the harmonics, that is a ratio of 2, 3, 4, 5, etc of the fundamental frequency. These correspond to values of n of ⅓, ⅛, 1/15, 1/24, etc.

It will be apparent that the calculation of impedances above is theoretical and that in a real world circuit, the filter circuit will neither have an infinite impedance (at $f_{peak}$) nor a zero impedance at $f_{notch}$. Accordingly the circuit will be neither be able to achieve zero attenuation of signals at the first frequency ($f_{peak}$) nor be able to achieve absolute attenuation of signals at the second frequency ($f_{notch}$).

Nevertheless, it will be apparent that a real world circuit constructed as described herein will attenuate signals at a first frequency ($f_{peak}$) by an amount which is low relative to the attenuation of signals at frequencies other than the first frequency ($f_{peak}$), and to attenuate signals at a second frequency ($f_{notch}$) by an amount which is high relative to the attenuation of signals at frequencies other than the second frequency ($f_{notch}$).

FIGS. 3A and 3B show alternative versions of the circuit shown in FIG. 1. The circuit 10 in FIG. 1 is suitable for an unbalanced, or non-differential signal; that is when a single line carries a signal, which varies relative to a fixed reference voltage. The circuits shown in FIGS. 3A and 3B are correspondingly suited for a balanced signal; that is where two signal lines carry balanced, opposed, signals.

The circuits in FIGS. 3A and 3B are similar in construction to that in FIG. 1, and may be taken to be equivalent impedance transforms of the circuit from FIG. 1. In FIG. 3A, circuit 30A has a first connection 12 to a first signal line 16. In addition, the circuit 30A has a second connection 14 to a second signal line 32.

The circuit 30A has a first circuit portion 20 which comprises a parallel resonant circuit. This parallel resonant circuit comprises a first inductor 24 connected in parallel with variable capacitor 26. The variable capacitor 26 has an input 27.

The circuit 30A also comprises a second circuit portion 22 and a third circuit portion 34. The second circuit portion 22 and third circuit portion 34 comprise second and third inductors 28 and 36 respectively. The first 20, second 22 and third 34 circuit portions are connected in series between the first 12 and second 14 connections, the first circuit portion 20 being connected between the second 22 and third 34 circuit portions.

The circuit 30B shown in FIG. 3B, is similar to the circuit 30A shown in FIG. 3A, and as such the same reference numerals have been used for corresponding components. The circuit 30B differs from 30A in the addition of a third connection 38 to a reference line, represented by ground 18. The reference line may alternatively be the source voltage line, $V_{DD}$. In this circuit 30B the first circuit portion 20 comprises a first inductor 24 and a fourth inductor 24, connected in series. The first and fourth inductors 24 and 24' are together connected in parallel with the variable capacitor 26. The third connection 38 is connected between the first and fourth inductors 24 and 24'. It will be apparent that the circuit shown in FIG. 3B is equivalent to placing the third connection 38 at a mid-point of first inductor 24.

Thus, while circuit 30A comprises a virtual ground present within the inductor 24, circuit 30B has a physical connection to ground. As a consequence, the first inductor 24 from circuit 30A is effectively split into the first and fourth inductors 24 and 24'. The operation of the circuits, in terms of resonant frequency, is similar. However these circuits have differing responses to imbalances in the signal lines.

The equations governing the performance, and thus the performance of the circuits 30A and 30B shown in FIGS. 3A and 3B are similar to that of the circuit 10 shown in FIG. 1, and will therefore not be described in detail. Nevertheless, it will be noted that in the circuit 30A, the first inductor 24 has an inductance or 2L, while in the circuit 30B the first 24 and fourth 24' inductors have inductors have inductances of L. Thus it will be apparent that in circuit 30A, the first inductor 24 is equivalent to the first 24 and fourth 24' inductors of circuit 30B combined.

In embodiments described herein, the functionality of the variable capacitor can be provided by a variable capacitor, such as that described above, or by a bank of selectable capacitors and/or a varactor. It will be apparent that any variable capacitance may be used. Moreover, control circuitry may be connected to the filter circuit to control the capacitance of the variable capacitor, and thus the first and second frequencies, $f_{peak}$ and $f_{notch}$.

Figure 4:
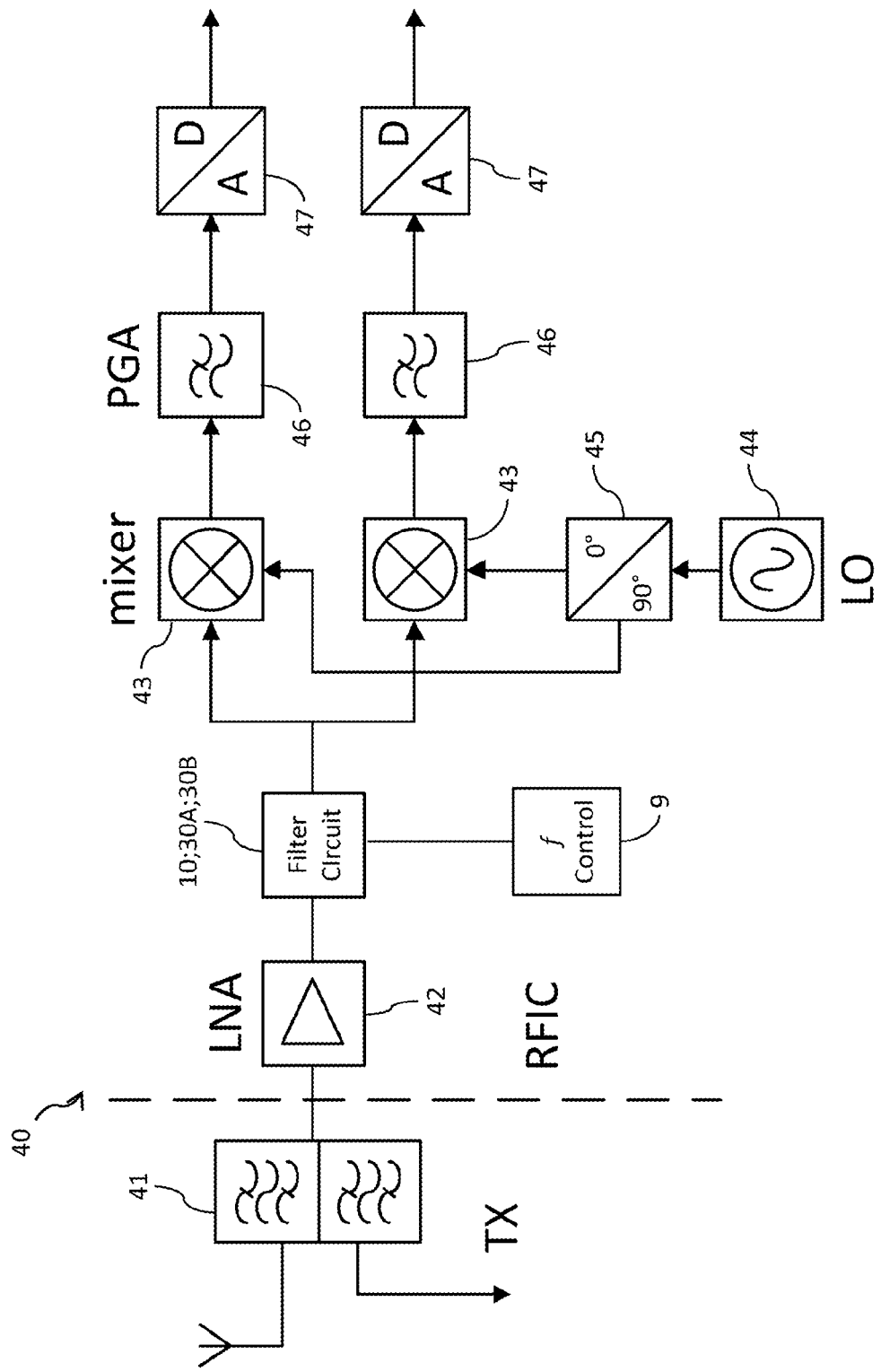
FIG. 4 shows receiver circuitry including a filter circuit according to an embodiment.

FIG. 4 shows a block diagram of a direct conversion receiver chain in which the circuits 10, 30A or 30B may be used. The receiving chain may be a part of a receiver or a transceiver. A number of the elements in the receiver chain are well known in the art and so will not be described in detail herein.

The input to the receiver chain is provided by filter module 41, e.g. in the form of a duplex filter, which is configured to be connected to an antenna. The filter module 41 operates to separate signals being transmitted from the signals received. Radio frequency (RF) signals are received at the splitter 41 and passed to the receiver chain.

Within the receiver chain, the signals are first received and amplified by a low noise amplifier (LNA) 42. The output of the LNA is connected to a filter circuit, such as circuit 10, 30A or 30B described above. The filtered output of the LNA is in turn provided to mixers 43. Two mixers are provided, one for each of the I and Q paths.

The filter circuit is therefore connected between the LNA 42 and the mixers 43, to filter signals being passed from the LNA 42 to the mixers 43. Control circuitry 9 may be provided to control the capacitance of the variable capacitor 26 via input connection 27 and thus control the resonant frequencies of the filter circuit $f_{peak}$ and $f_{notch}$.

The mixers themselves receive a local oscillator signal from a local oscillator (LO) 44. The signal from the LU 44 is typically a square wave as described above. The signal from the LU 44 is passed through a phase shifter which provides two signals, one to each of the mixers, and being phase shifted by 90° with respect to one another.

The mixers 43 downconvert the received RF signal to baseband (BB) and pass the result to programmable gain amplifiers (PGA) 46. The output of the PGAs is then digitally sampled at analogue digital (A/D) converters 47. The resulting data is then passed to digital circuitry in which the signal data is extracted. In use, $f_{peak}$ of the filter circuit 10, 30A or 30B can be tuned to the desired RF signal. As a result, the $f_{notch}$ is, in this example, tuned to the third harmonic of this RF signal.

With reference to the example described above, if $f_{peak}$ is 800 MHz then $f_{notch}$ is 2.4 GHz. As a result, the 2.4 GHz signal passed to the mixers has been highly attenuated. The local oscillator 44 will also be tuned to 800 MHz, and as a consequence of the high harmonic content of a square wave, the output of the local oscillator will have a strong third harmonic at 2.4 GHz. Both the 800 MHz fundamental and the 2.4 GHz harmonic will be passed to the mixers; however since the RF input to the mixers at 2.4 GHz has been attenuated by the filter circuit 10;30A;30B, the baseband signal output by the mixers will correspondingly have a small component from the 2.4 GHz unwanted signal. Thus, the signal to noise ratio of the output of the mixers is increased, and the overall performance of the system improved.

Figure 5:
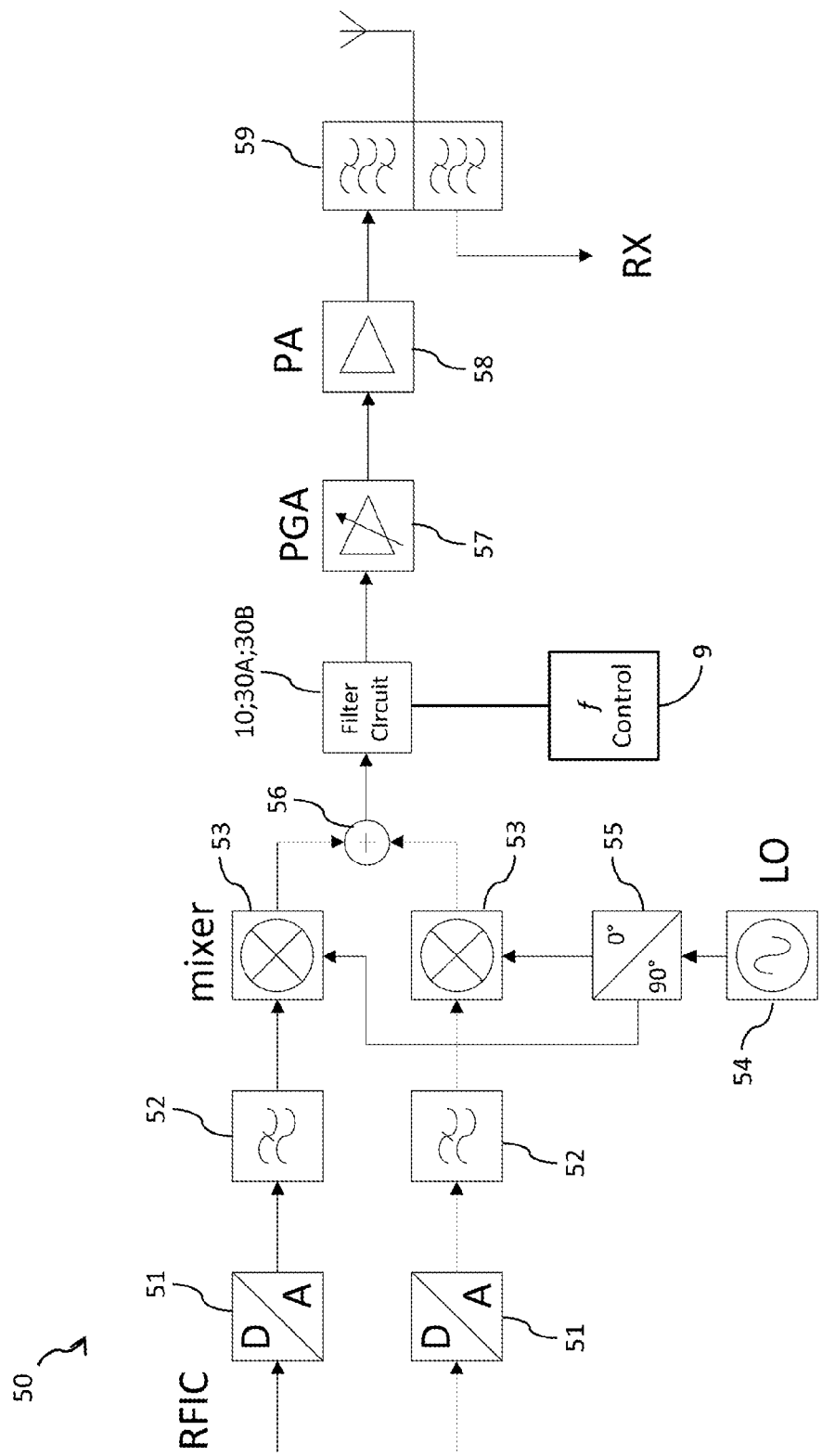
FIG. 5 shows transmitter circuitry including a filter circuit according to an embodiment.

FIG. 5 shows a block diagram of a direct conversion transmitter chain in which the circuits 10, 30A or 30B may be used. The transmitting chain may be a part of a transmitter or a transceiver. A number of the elements in the transmitter chain are well known in the art and so will not be described in detail herein.

The input to the transmitter chain is provided by to digital analogue (D/A) converters 51, which convert digital data to baseband analogue waveforms. There are two digital to analogue converters 51 corresponding to the I and Q paths. These baseband waveforms are then provided by the D/A converters 51 to low pass filters 52 and from the low pass filters 52 to mixers 53.

The mixers receive a local oscillator signal from a local oscillator 54 via a phase shifter 55. The phase shifter 55 provides two signals, one to each of the mixers 53, one of the signals being phase shifted by 90° from the other. The mixers 53 upconvert the baseband waveform provided via the low pass filters 52 to radio frequency (RF), based on the frequency of the input from the local oscillator 54. The RF signals from the two mixers are then combined in summer 56.

The output of the summer 56 is connected to a filter circuit such as circuit 10, 30A or 30B described above. The filtered output of the summer 56 is then received by a programmable gain amplifier (PGA) 57.

The filter circuit is therefore connected between the mixers 53 and the PGA 57 and operates to filter signals passing from the mixers 53 to the PGA 57. Control circuitry 9 may be provided to control the capacitance of the variable capacitor 26 via input connection 27, and thus control the resonant frequencies of the filter circuit $f_{peak}$ and $f_{notch}$.

The PGA 57 amplifies the RF signal, which is then passed through a PA 58 to splitter 59. The filter module 59 provides an output to an antenna, and serves to separate the transmitter chain from the receiver chain.

In use, $f_{peak}$ of the filter circuit 10, 30A or 30B can be tuned to the desired RF signal. As a result, in this example, the $f_{notch}$ is tuned to the third harmonic of this RF signal. The local oscillator 44 will also be tuned to the desired RF signal, and as a consequence of the high harmonic content of a square wave, the output of the local oscillator will have a strong third harmonic at three times the RF signal. Therefore, the output of the mixer will have the desired signal at the RF, and a relatively strong unwanted signal at three times the desired RF. This unwanted signal is attenuated by the filter circuit 10, 30A or 30B, and therefore is reduced in gain upon receipt by the PGA 57.

As described above, intermodulation between strong unwanted distortion products and desired signals can cause intermodulation products to be created near the desired RF, i.e. in a neighboring channel. By reducing the gain (i.e. attenuating) the unwanted signal at three times RF, the magnitude of such intermodulation products is reduced, improving the performance of the transmitter.

Some implementation specifics of how a circuit such at the circuits shown in FIG. 3B may be constructed will now be described with reference to FIGS. 6A, 6B, 7A, 7B, 8A, 8B, 9A and 9B. FIGS. 6A, 7A, 8A and 9A show circuit diagrams, while FIGS. 6B, 7B, 8B and 9B show layout diagrams for a monolithic construction of the circuits on a chip. The components of the circuit are the same as those described with reference to FIG. 3B, and will not be described in detail. The reference numerals from FIG. 3B have been included to assist in identifying the components.

FIGS. 6A and 6B show a first arrangement for a filter circuit according to an embodiment. As shown in FIG. 6B, the first and fourth inductors 24 and 24', that is the inductors within the first circuit portion 20 of the circuit, are counter-wound and have a coupling coefficient k resulting from the resulting and relatively strong mutual inductance therebetween. The first and fourth inductors 24 and 24' are formed on a first area 63 of the chip.

By contrast the second and third inductors 28 and 36, that is the inductors making up the second and third circuit portions of the circuit, are formed on different areas 61 and 62 of the chip. Consequently, there is a relatively small mutual inductance between the second inductor 28 and any other inductor of the circuit or between the third inductor 36 and other inductors of the circuit.

This circuit arrangement shown in FIG. 6B is the simplest in terms of design, as there are few mutual inductances to take into account and the mutual inductance between the first and fourth inductors 24 and 24' results in a reduction of common mode signals in the signal lines; however the circuit also requires the greatest amount of die area on the chip.

Figure 7B:
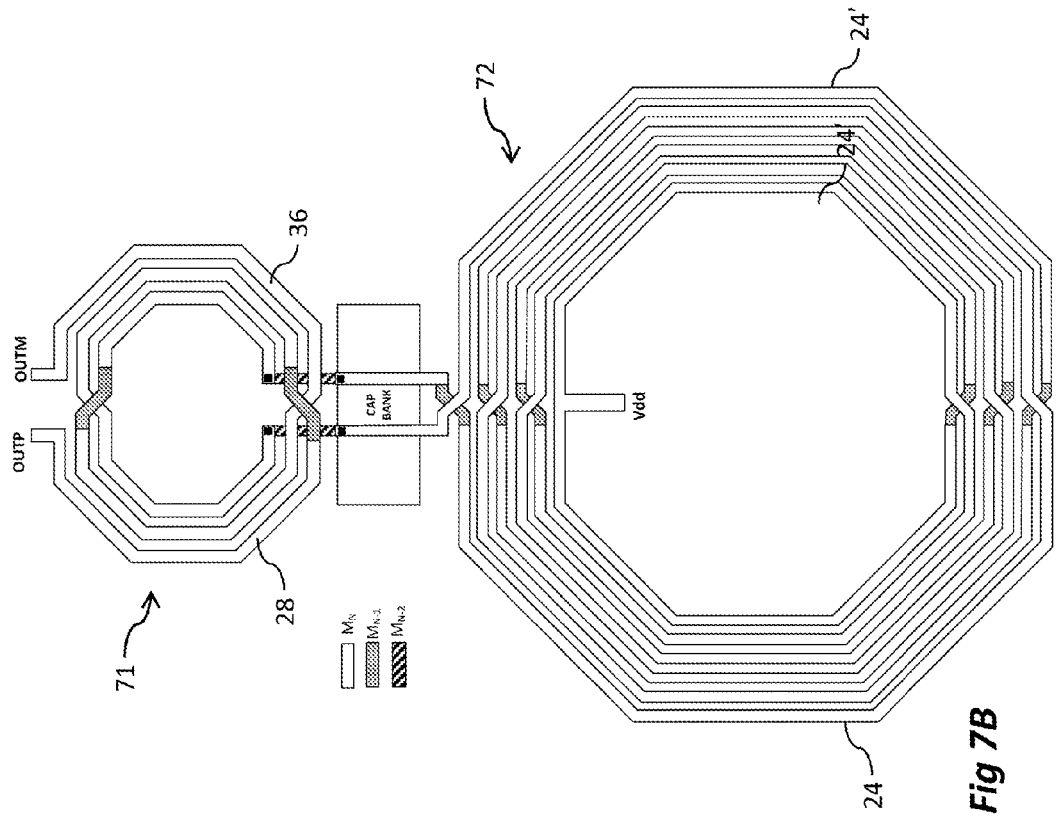
Figure 7A:
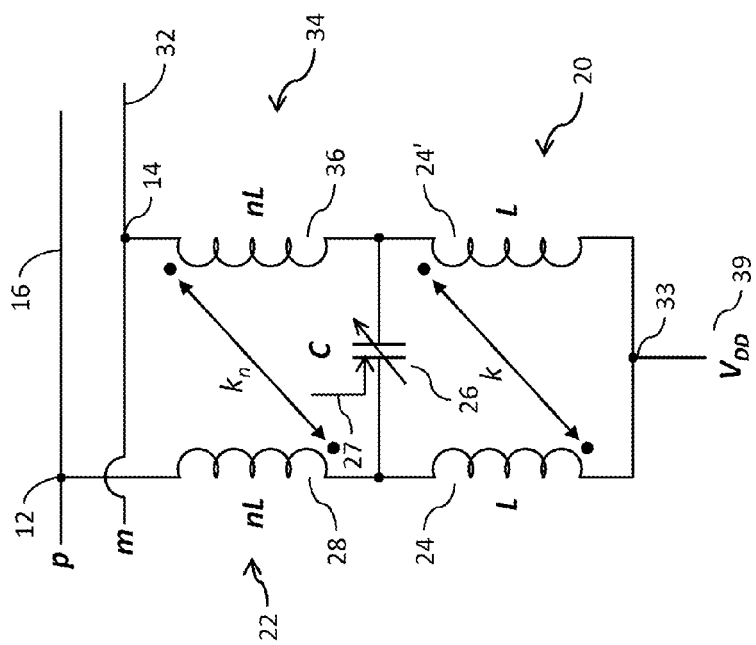

In the circuit shown in FIGS. 7A and 713, the first and fourth inductors 24 and 24' are again co-centered and counter-wound, have a coupling coefficient k, and are formed on a first area 72 of the chip. The circuit shown in FIGS. 7A and 7B differs from that in FIGS. 6A and 6B in that the second and third inductors 28 and 36, that is the inductors within the second and third circuit portions of the circuit, are co-centered and counter-wound, have a coupling coefficient $k_n$, and are located within a second area 71. This provides improved reduction of common mode signals in the signal lines, and uses a slightly smaller die area, however it requires a custom inductor design.

In FIGS. 8A and 8B show an arrangement in which all of the first, second, third and fourth inductors—24, 28, 36 and 24 respectively—are formed in the same area 81 of the chip. The second and third inductors 28 and 36, that is the inductors of the second and third circuit portions of the circuit, are arranged around the outside of the first and fourth inductors 24 and 24, the latter forming the first portion of the circuit. This arrangement provides a more compact circuit, i.e. one which uses less die area than the circuits described above. There is mutual inductance between the first and fourth inductors 24 and 24' with the second and third inductors 28 and 36 individually. However the second and third inductors 28 and 36 have no mutual inductance. While this arrangement is compact, it can be difficult to design due to the difficulties in determining the inductances of the second and third inductors 28 and 36 which requires custom layout and analysis with electromagnetic simulator.

Finally, FIGS. 9A and 913 show a circuit in which the first, second, third and fourth inductors—24, 28, 36 and 24' respectively—are all co-centered within the same area 91 of the chip. The first and fourth inductors 24 and 24, and the second and third inductors 28 and 36 are counter wound. This arrangement is also compact, and provides the greatest mutual inductance, leading to increased rejection of common mode signals. However it is also the hardest to design as allowances must be made for these mutual inductances; as a result the circuit design typically requires iteratively generated custom layout and use of an electromagnetic simulator.

FIGS. 10 and 11 show arrangements by which the circuit 3013 described above may be connected to a low noise amplifier, such as the LNA 42 described in FIG. 4.

The circuit 100 comprises a low noise amplifier (LNA) 101, which is connected to first and second inputs 106 and 107, marked $in_p$ and $in_m$. These inputs 106 and 107 receive positive and negative balanced signals, which may come from e.g. filter module 41 in the form of a duplexer shown in FIG. 4. The LNA 101 has first and second outputs 102 and 103, which are connected to first and second signal lines 16 and 32 respectively. The signal lines 16 and 32 are connected to first and second connections 12 and 14 of the filter circuit, which, in turn, are connected to the aforementioned second and third circuit portions 22, 34. The remainder of the circuit corresponds to that described above in relation to FIG. 3B In operation, the LNA 101 receives and amplifies a differential signal received via inputs 106 and 107. This amplified output is then filtered by the first, second and third circuit portions 20, 22 and 34. The operation of these portions within circuit 100 is similar to that of the circuit 30B in FIG. 3B, and will therefore not be described in detail.

While the above circuit uses a LNA 101 having a balanced output, it will further be apparent that a LNA providing an un-balanced output may be used with a circuit such as the circuit shown in FIG. 1 to provide an amplified and filtered signal.

FIG. 11 shows a circuit comprising an LNA having a resistive feedback loop. Circuit 110 includes all of the components from the circuit 100, and additionally comprises first and second nodes 111 and 112. The first node 111 is connected between the first and the second circuit portions 20 and 22. The second node 112 is connected between the first and third circuit portions 20 and 34. The circuit 110 also comprises first and second resistors 113 and 114. The first resistor 113 is connected between the first input 106 of the LNA 101 and the first node 111. The second resistor 114 is connected between the second input 107 of the LNA 101 and the second node 112.

The nodes 111 and 112 function as feedback nodes for the LNA 101. The feedback nodes 111 and 112, in combination with resistors 113 and 114 increase the voltage gain at the second frequency $f_{notch}$. This results in a lower LNA input impedance for signals at, or near, the second frequency and therefore a higher attenuation of these signals in the output of the circuit.

FIG. 12 shows an arrangement 120 in which a circuit such as the circuit 30A described above in FIG. 3A is connected to a programmable gain amplifier (PGA), such as the PGA 57 shown in FIG. 5. The circuit 120 comprises a programmable gain amplifier (PGA) 121. The PGA 121 has first and second inputs 126 and 127, and first and second outputs 122 and 123. These outputs 122 and 123 are connected to signal lines 16 and 32. The signal lines 16 and 32 are in turn connected to first and second outputs 124 and 125, marked $out_p$ and $out_m$ respectively. The inputs 126 and 127 receive positive and negative balanced signals which may come from e.g. mixer 53 shown in FIG. 5. The first input 126 ($in_p$) is connected to the positive input of the PGA 121, while the second input 127 ($in_m$) is connected to the negative input of the PGA 121. Connections 12 and 14 of the filter circuit are connected to the signal lines 16 and 32.

Connected in series between the connections 12 and 14 are first, second and third circuit, portions 20, 22 and 34. The first circuit portion 20 is connected between the second and third circuit portions 22 and 34. The second circuit portion 22 is connected to the connection 12 and the third circuit portion 34 is connected to the connection 14. In operation, the PGA 121 receives and amplifies a differential signal received on connections 126 and 127. The amplified output of the amplifier 121 is then filtered by the first, second and third circuit portions 20, 22 and 34.

In some embodiments, the inductances nL and L may be selected so that a relatively high attenuation is provided to a third harmonic of the desired signal. This may be used to remove undesired harmonic signals generated either from the LO signal, or within the amplifier itself. In alternative embodiments the inductances nL and L may be selected so that a relatively high attenuation is provided to a second, fourth or other harmonic of the desired signal.

While the circuit 120 in FIG. 12 is shown with a programmable gain amplifier (PGA) 121, it is possible to connect the first and second connections to a power amplifier (PA), such as PA 58 shown in FIG. 58.

FIG. 13 shows an arrangement 150 in which a circuit such as circuit 10 shown in FIG. 1 is connected to a programmable gain amplifier (PGA) 131 such as PGA 57. The circuit 130 comprises a programmable gain amplifier (PGA) 121. The PGA 121 has an input 132 and an output 133. The PGA 131 is configured to amplify an unbalanced input signal. The output 133 is connected to signal line 16. The signal line 16 is in turn connected to output 134, marked out. The input 132 receives an unbalanced signal which may come from e.g. mixer 53 shown in FIG. 5. The PGA 131 amplifies the unbalanced signal, and outputs an amplified signal on output 133. Thus an unbalanced signal is present on signal line 16.

First 20 and second 22 circuit portions are connected in series between first and second connections 12 and 14. The first connection 12 is connected to signal line 16. The second connection 14 is connected to a reference voltage, in this example ground 18.

In operation, the PGA receives and amplifies an unbalanced signal. The amplified signal is then filtered by the circuit to provide a filtered output on connection 134, which comprises an output of the circuit.

Figures 14, 15:
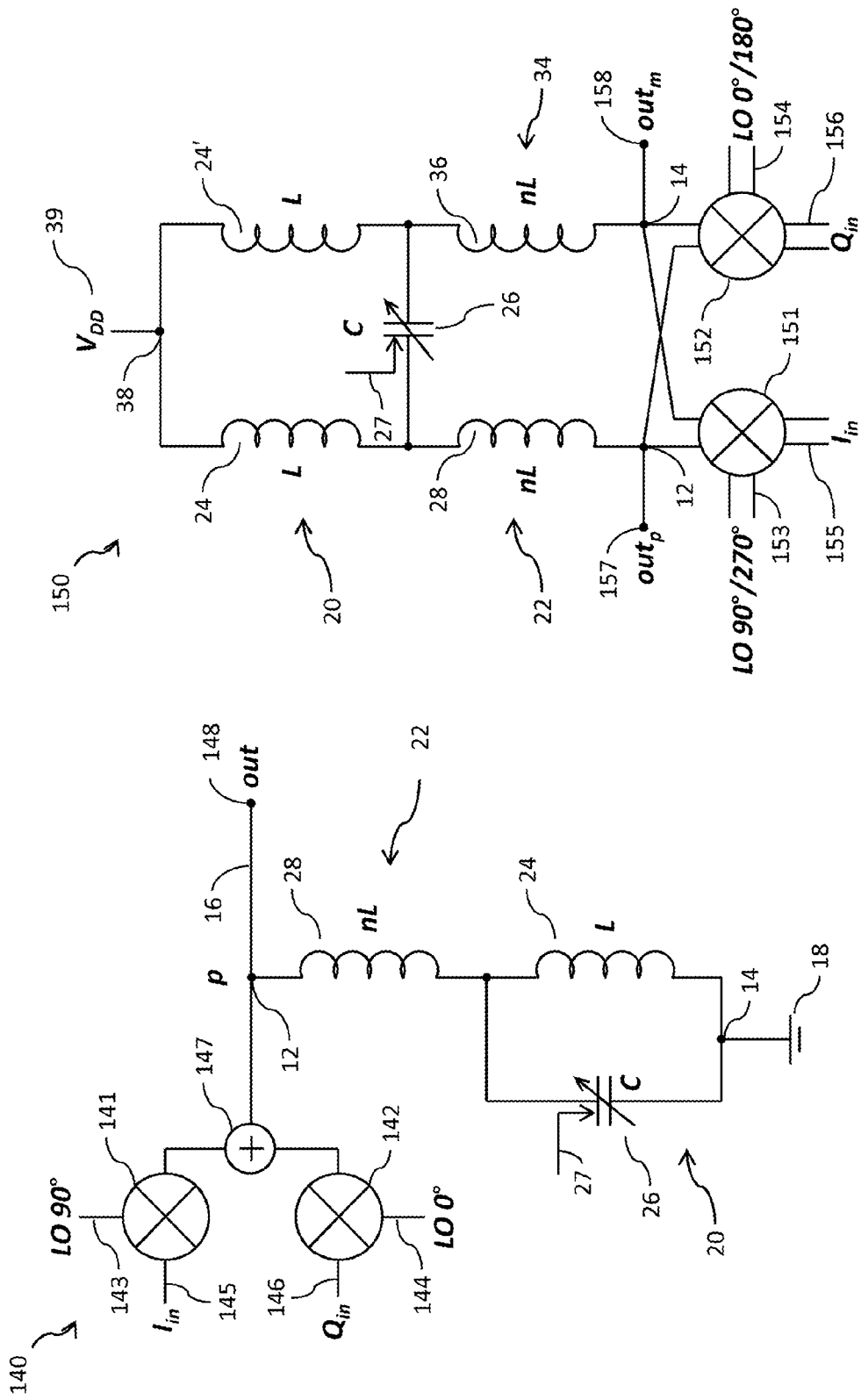
FIGS. 14 and 15 show circuit diagrams for filter circuits in combination with a mixer according to embodiments.
Figure 16:
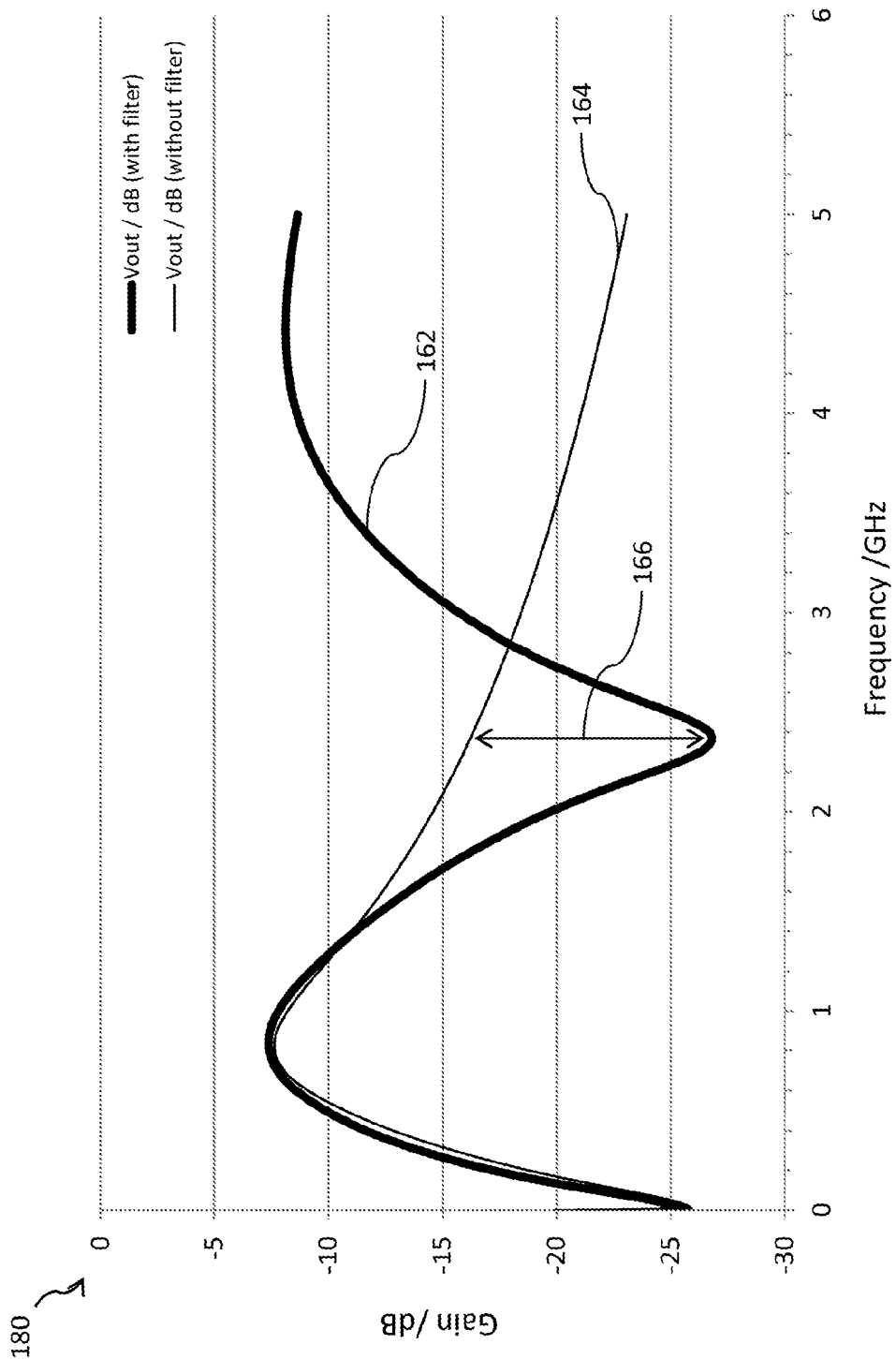
FIG. 16 shows a plot of gain against frequency for an exemplary circuit according to an embodiment.

FIG. 14 shows an arrangement in which a filter circuit, such as filter circuit 10 described in FIG. 1 is connected to mixers, such as mixers described above in relation to FIG. 5, in FIG. 14 I and Q mixers, 141 and 142 respectively, are connected to I and Q inputs 145 and 146. The mixers 141 and 142 are further connected to local oscillator (LO) signals 143 and 144 respectively which are appropriately phase shifted with respect of each other.

The outputs of the mixers 141 and 142 are combined in element 147 to provide a single unbalanced signal on signal line 16. The first connection 12 is connected to the signal line 16, as is output 148. In operation, the mixers 141 and 142 mix signals received on inputs 145 and 146 with the LO signals 143 and 144, and provide outputs to element 147, where the signals are summed, and provided as an output on signal line 16. The first and second circuit portions 20 and 22 operate in as described above to filter this signal. Therefore a mixed and filtered output is provided by the arrangement 140 shown in FIG. 14.

FIG. 15 shows another arrangement in which a filter circuit, such as filter circuit 30B described in FIG. 3B is connected to mixers. In FIG. 15 I and Q mixers, 151 and 152 respectively, are connected to I and Q inputs 155 and 156. The mixers 151 and 152 are further connected to local oscillator (LO) signals 153 and 154 respectively which are appropriately phase shifted with respect of each other.

As shown, an output from mixer 151 and a further output from mixer 152 are connected to connection 12, while an output from mixer 151 and a further output from mixer 152 are connected to connection 14. The connections 12 and 14 are further connected to outputs 157 and 158. The filter circuit is similar to that described in FIG. 313, and so will not be described in detail. Nevertheless, circuit 150 comprises first, second and third circuit portions 20, 22 and 34 as described above connected in series between connections 12 and 14. In operation, the mixers 151 and 152 mix signals received on inputs 155 and 156 with the LO signals, and provide outputs to connections 12 and 14. In addition, the first, second and third circuit portions 20, 22 and 34 operate in accordance with the principles described above to filter the signal. Therefore a mixed and filtered output is provided by the arrangement 150 shown in FIG. 15.

It will be understood that, whereas in some circuits above the parallel resonant circuit comprises only a first inductor; whereas in other embodiments, the parallel resonant circuit comprises first and third inductors, with a connection to a reference voltage provided between the inductors. It will be understood that both arrangements are largely equivalent, where the two inductors together provide the equivalence of the single inductor.

Some of the above embodiments have been described in the context of the filter circuit being connected to the output of a mixer or amplifier, however it will be apparent that other arrangements are possible. For example, it is possible to integrate the filter circuit with a balun, whereby to provide a circuit which both filters an input signal as well as converting the input signal between being balanced and unbalanced.

Such a balun type circuit may be constructed by inductively coupling a further inductor to one of the inductors of the above described circuits; for example the first inductor. This further inductor may itself be connected between a first and a second output connection to provide a balanced signal, or between an output connection and a reference voltage to provide an unbalanced signal.

FIG. 18 shows a plot illustrating the performance gains which may be achieved by using a circuit such as the embodiments described above. FIG. 18 shows a plot of gain against frequency for a circuit arranged to attenuate a third harmonic, i.e. with H equal to 3 and therefore n equal to ⅛. The circuit has been tuned to give $f_{peak}$ equal to approximately 800 MHz, with $f_{notch}$ having a value of three times that, i.e. 2.4 GHz.

The thick line 162 shows the gain with a filter circuit according to an embodiment. The thin line 164 shows the gain with a simple parallel LC circuit, such as the one described in the background section. As can be seen, the filter circuit according to an embodiment provides an increase attenuation of over 10 dB at the notch frequency $f_{notch}$ of approximately 2.4 GHz marked with reference 166.

While the above description has focussed on CMOS direct conversion radio systems, it will be apparent that embodiments may be used in any other scenario where the particular filtering characteristics are desirable. It will further be apparent that a filter according to the embodiments may be combined with other filters to attenuate, for example, other harmonics.

The above description describes the various aspects of exemplary embodiments. For completeness some embodiments and their corresponding advantages will be described in summary from.

As illustrated in, for example, FIG. 4, in a first embodiment, there is provided circuitry for use in a direct conversion receiving chain for a radio receiver, the circuitry comprising: mixing circuitry configured to downconvert radio frequency signals to baseband; a local oscillator configured to provide a local oscillator signal to the mixing circuitry for use in the downconversion, the local oscillator signal comprising a first component and a second component corresponding to a harmonic of the first component; and a filter circuit configured to filter radio frequency signals input thereto and to output filtered radio frequency signals to the mixing circuitry, wherein the filter circuit is configured to attenuate radio frequency signals output at a first frequency by an amount which is low relative to the attenuation of signals output at frequencies other than the first frequency, and to attenuate signals output at a second frequency by an amount which is high relative to the attenuation of signals output at frequencies other than the second frequency, the filter circuit being tunable such that the first frequency can be tuned to correspond to a frequency of the first component of the local oscillator signal, and the filter circuit being configured such that the second frequency is maintained at a predetermined integer multiple of the first frequency.

An unwanted component in a local oscillator signal may downconvert an unwanted signal to baseband, and thus increase the unwanted components, i.e. noise, within the baseband signal. By pre-emptively filtering the received signal prior to downconversion the magnitude of the unwanted component in the output baseband signal is reduced. Thus the performance/sensitivity of the receiving circuitry is improved.

The predetermined integer described above may correspond to the order of the harmonic corresponding to the second component. In some cases, the local oscillator signal may comprise a plurality of harmonics and the second component may correspond to a one of the plurality of harmonics having the greatest amplitude of the plurality of harmonics. Alternatively, the second component may correspond to a harmonic which causes the greatest amount of noise in a downconverted signal, this corresponding to a combination of the strength of the harmonic in the local oscillator signal and the strength of an unwanted signal at a frequency corresponding to the harmonic. Exemplary values for the predetermined integer are two or three.

The local oscillator signal may be a square wave. Square waves have a strong harmonic content, in particular a strong third harmonic. Therefore by making the predetermined integer correspond to the order of this harmonic, any unwanted signals corresponding to this signal may be removed.

The filter circuit may comprise a parallel resonant circuit connected in series with at least one inductor. The parallel resonant circuit may comprise at least one further inductor connected in parallel with a variable capacitance, where the variable capacitance may be varied to tune the filter circuit. The variable capacitance may comprise a variable capacitor, a bank of independently selectable capacitors and/or a varactor.

As illustrated in, for example, FIG. 5, in a second embodiment, there is provided circuitry for use in a direct conversion transmitting chain for a radio transmitter, the circuitry comprising: mixing circuitry configured to upconvert a baseband signal and thereby output an upconverted radio frequency signal; a local oscillator configured to provide a local oscillator signal to the mixing circuitry for use in the upconversion, the local oscillator signal comprising a first component and a second component corresponding to a harmonic of the first component; and a filter circuit configured to filter radio frequency signals output by the mixing circuitry, wherein the filter circuit is configured to attenuate radio frequency signals output at a first frequency by an amount which is low relative to the attenuation of signals output at frequencies other than the first frequency, and to attenuate signals output at a second frequency by an amount which is high relative to the attenuation of signals output at frequencies other than the second frequency, the filter circuit being tunable such that the first frequency can be tuned to correspond to a frequency of the first component of the local oscillator signal, and the filter circuit being configured such that the second frequency is maintained at a predetermined integer multiple of the first frequency.

An unwanted component in a local oscillator signal may upconvert the baseband signal, and thus provide an unwanted component which may create an out of band transmission, interfering with other equipment. This out of band transmission may be generated by intermodulation in the circuitry. By filtering the output of the mixer signal the magnitude of the unwanted signal is reduced. Thus the strength of unwanted signals being transmitted is reduced.

The predetermined integer described above may correspond to the order of the said harmonic corresponding to the second component. In some cases, the local oscillator signal may comprise a plurality of harmonics and the second component corresponds to a one of the plurality of harmonics having the greatest amplitude of the plurality of harmonics. Exemplary values for the predetermined integer are two or three.

The local oscillator signal may be a square wave. Square waves have a strong harmonic content, in particular a strong third harmonic. Therefore by making the predetermined integer correspond to the order of this harmonic, any unwanted signals corresponding to this signal may be removed.

The filter circuit may comprise a parallel resonant circuit connected in series with at least one inductor. The parallel resonant circuit may comprise at least one further inductor connected in parallel with a variable capacitance, and wherein the variable capacitance is varied to tune the filter circuit. The variable capacitance may comprise a variable capacitor, a bank of independently selectable capacitors and/or a varactor.

It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims. The features of the claims may be combined in combinations other than those specified in the claims.

The invention claimed is:

1. A circuitry for use in a direct conversion receiving chain for a radio receiver, the circuitry comprising:

mixing circuitry configured to downconvert radio frequency signals to baseband;

a local oscillator configured to provide a local oscillator signal to the mixing circuitry for use in the downconversion, the local oscillator signal comprising a first component and a second component corresponding to a harmonic of the first component; and a filter circuit configured to filter radio frequency signals input thereto and to output filtered radio frequency signals to the mixing circuitry, wherein the filter circuit is configured to attenuate radio frequency signals output at a first frequency by an amount which is low relative to the attenuation of signals output at frequencies other than the first frequency, and to attenuate signals output at a second frequency by an amount which is high relative to the attenuation of signals output at frequencies other than the second frequency, the filter circuit being tunable such that the first frequency can be tuned to correspond to a frequency of the first component of the local oscillator signal, and the filter circuit being configured such that the second frequency is maintained at a predetermined integer multiple of the first frequency.

2. The circuitry of claim 1, wherein the predetermined integer corresponds to the order of the said harmonic corresponding to the second component.

3. The circuitry of claim 2, wherein the local oscillator signal comprises a plurality of harmonics and the second component corresponds to a one of the plurality of harmonics having the greatest amplitude of the plurality of harmonics.

4. The circuitry of claim 1, wherein the predetermined integer is two or three.

5. The circuitry of claim 1, wherein the local oscillator signal is a square wave.

6. The circuitry of claim 1, wherein the filter circuit comprises a parallel resonant circuit connected in series with at least one inductor.

7. The circuitry of claim 6, wherein the parallel resonant circuit comprises at least one further inductor connected in parallel with a variable capacitance, and wherein the variable capacitance is varied to tune the filter circuit.

8. The circuit of claim 7, wherein the variable capacitance comprises a variable capacitor, a bank of independently selectable capacitors and/or a varactor.

9. A circuitry for use in a direct conversion transmitting chain for a radio transmitter, the circuitry comprising:

mixing circuitry configured to upconvert a baseband signal and thereby output an upconverted radio frequency signal;

a local oscillator configured to provide a local oscillator signal to the mixing circuitry for use in the upconversion, the local oscillator signal comprising a first component and a second component corresponding to a harmonic of the first component; and a filter circuit configured to filter radio frequency signals output by the mixing circuitry, wherein the filter circuit is configured to attenuate radio frequency signals output at a first frequency by an amount which is low relative to the attenuation of signals output at frequencies other than the first frequency, and to attenuate signals output at a second frequency by an amount which is high relative to the attenuation of signals output at frequencies other than the second frequency, the filter circuit being tunable such that the first frequency can be tuned to correspond to a frequency of the first component of the local oscillator signal, and the filter circuit being configured such that the second frequency is maintained at a predetermined integer multiple of the first frequency.

10. The circuitry of claim 9, wherein the predetermined integer corresponds to the order of the said harmonic corresponding to the second component.

11. The circuitry of claim 10, wherein the local oscillator signal comprises a plurality of harmonics and the second component corresponds to a one of the plurality of harmonics having the greatest amplitude of the plurality of harmonics.

12. The circuitry of claim 9, wherein the predetermined integer is two or three.

13. The circuitry of claim 9, wherein the local oscillator signal is a square wave.

14. The circuitry of claim 9, wherein the filter circuit comprises a parallel resonant circuit connected in series with at least one inductor.

15. The circuitry of claim 14, wherein the parallel resonant circuit comprises at least one further inductor connected in parallel with a variable capacitance, and wherein the variable capacitance is varied to tune the filter circuit.

16. The circuit of claim 15, wherein the variable capacitance comprises a variable capacitor, a bank of independently selectable capacitors and/or a varactor.

* * * * *